United States Patent [19]

Ohba et al.

[11] Patent Number: 4,841,255
[45] Date of Patent: Jun. 20, 1989

[54] FREQUENCY SYNTHESIZER

[75] Inventors: Motoi Ohba; Mitsuo Makimoto, both of Yokohama, Japan

[73] Assignee: Matsushita Electric Industrial Co., Ltd., Osaka, Japan

[21] Appl. No.: 210,456

[22] Filed: Jun. 23, 1988

[30] Foreign Application Priority Data

Jun. 24, 1987 [JP] Japan .................................. 62-156814

[51] Int. Cl.⁴ ............................................. H03L 7/18
[52] U.S. Cl. ........................................ 331/14; 331/16; 331/18; 331/25
[58] Field of Search ...................... 331/14, 16, 17, 18, 331/25, DIG. 2; 455/260

[56] References Cited

U.S. PATENT DOCUMENTS 4,673,892  6/1987  Miyashita et al. ................... 331/14

FOREIGN PATENT DOCUMENTS 60-248022  12/1985  Japan .
62-16617   1/1987  Japan .

Primary Examiner—David Mis
Attorney, Agent, or Firm—Pollock, VandeSande & Priddy

[57] ABSTRACT

A first oscillator outputs a signal having a reference frequency. A first frequency divider divides the frequency of the output signal from the first oscillator. A second oscillator outputs a signal having a target frequency. A second frequency divider divides the frequency of the output signal from the second oscillator. A phase comparator compares phases of output signals from the first and second frequency dividers. An integrator integrates an output signal from the phase comparator and controls the second oscillator in accordance with the integration of the output signal from the phase comparator. A first gate is connected between the first oscillator and the first frequency divider. A second gate is connected between the second oscillator and the second frequency divider. A third gate is connected between the phase comparator and the integrator. The first gate, the second gate, and the third gate are controlled in accordance with the output signals from the first and second frequency dividers and with an external synthesizer control signal.

10 Claims, 5 Drawing Sheets

FREQUENCY SYNTHESIZER

BACKGROUND OF THE INVENTION

This invention relates to a frequency synthesizer usable in various electronic apparatuses such as a transceiver.

Frequency synthesizers including a phase-locked loop (PLL) circuit are widely used in multi-channel transceivers. Conventional frequency synthesizers tend to consume electric power at high rates.

Japanese published unexamined patent application No. 62-16617 discloses an advanced frequency synthesizer in which a PLL circuit is intermittently activated and deactivated to save electric power. This prior-art synthesizer includes special components which serve to quickly stabilize the synthesizer output upon the activation of the PLL circuit.

SUMMARY OF THE INVENTION

It is an object of this invention to provide a frequency synthesizer which is stable during intermittently powered operation.

In a first frequency synthesizer of this invention, a first oscillator outputs a signal having a reference frequency. A first frequency divider divides the frequency of the output signal from the first oscillator. A second oscillator outputs a signal having a target frequency. A second frequency divider divides the frequency of the output signal from the second oscillator. A phase comparator compares phases of output signals from the first and second frequency dividers. An integrator integrates an output signal from the phase comparator and controls the second oscillator in accordance with the integration of the output signal from the phase comparator. A first gate is connected between the first oscillator and the first frequency divider. A second gate is connected between the second oscillator and the second frequency divider. A third gate is connected between the phase comparator and the integrator. The first gate, the second gate, and the third gate are controlled in accordance with the output signals from the first and second frequency dividers and with an external synthesizer control signal.

In a second frequency synthesizer of this invention, a first oscillator outputs a signal having a reference frequency. A first frequency divider divides the frequency of the output signal from the first oscillator. A second oscillator outputs a signal having a target frequency. A second frequency divider divides the frequency of the output signal from the second oscillator. A phase comparator compares phases of output signals from the first and second frequency dividers. A charge pump converts an output signal from the phase comparator into a corresponding integrator drive signal. An integrator integrates the drive signal and controls the second oscillator in accordance with the integration of the drive signal. A first gate is connected between the first oscillator and the first frequency divider. A second gate is connected between the second oscillator and the second frequency divider. A third gate is connected between the phase comparator and the integrator. The first gate, the second gate, and the third gate are controlled in accordance with the output signal from the phase comparator, the output signal from the first frequency divider, and an external synthesizer control signal.

In a third frequency synthesizer of this invention, a first oscillator outputs a signal having a reference frequency. A first frequency divider divides the frequency of the output signal from the first oscillator. A second oscillator outputs a signal having a target frequency. A second frequency divider divides the frequency of the output signal from the second oscillator. A phase comparator compares phases of output signals from the first and second frequency dividers. A charge pump converts an output signal from the phase comparator into a corresponding integrator drive signal. An integrator integrates the drive signal and controls the second oscillator in accordance with the integration of the drive signal. A first gate is connected between the first oscillator and the first frequency divider. A second gate is connected between the second oscillator and the second frequency divider. A third gate is connected between the phase comparator and the integrator. The first gate, the second gate, and the third gate are controlled in accordance with the output signal from the phase comparator, the output signal from the second frequency divider, and an external synthesizer control signal.

DESCRIPTION OF THE FIRST PREFERRED EMBODIMENT

Figure 1:
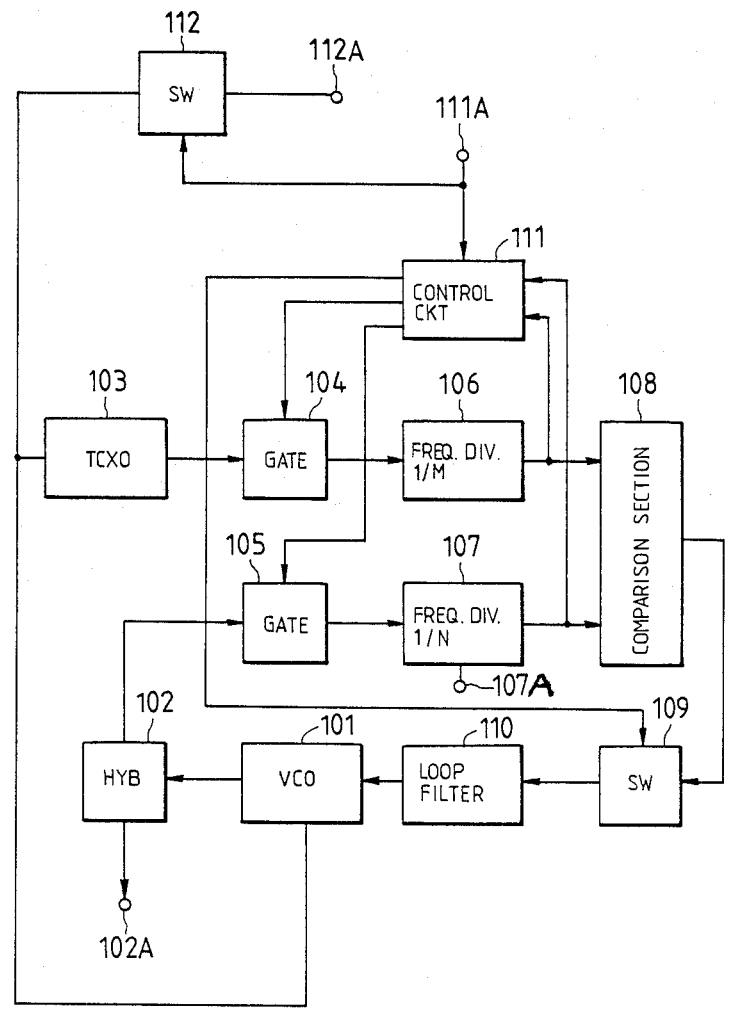
FIG. 1 is a block diagram of a frequency synthesizer according to a first embodiment of this invention.

With reference to FIG. 1, a frequency synthesizer according to a first embodiment of this invention includes a voltage-controlled oscillator (VCO) 101 outputting a radio frequency (RF) signal to a distribution device or a hybrid (HYB) 102. The device 102 distributes the RF signal to an RF output terminal 102A and an input terminal of a gate or switch 105. An output terminal of the gate 105 is connected to an input terminal of a variable frequency divider 107. A control terminal of the gate 105 is connected to a control circuit 111. The gate 105 selectively allows and inhibits the application of the RF signal to the variable frequency divider 107 in accordance with a control signal supplied from the control circuit 111. The frequency divider 107 generates a signal whose frequency equals the frequency of the input signal divided by a variable number N. A control terminal of the frequency divider 107 is connected to a setting terminal 107A so that the number N is adjusted in accordance with a setting signal transmitted via the setting terminal 107A. The setting signal determines a used RF channel. An output signal from the frequency divider 107 is applied to a first input terminal of a comparison section 108. In addition, the output signal from the frequency divider 107 is transmitted to the control circuit 111.

A temperature compensated crystal oscillator (TCXO) 103 outputs a reference RF signal of a constant frequency to an input terminal of a gate or switch 104. An output terminal of the gate 104 is connected to an input terminal of a frequency divider 106. A control terminal of the gate 104 is connected to the control circuit 111. The gate 104 selectively allows and inhibits the application of the RF signal to the frequency divider 106 in accordance with a control signal supplied from the control circuit 111. The frequency divider 106 generates a signal whose frequency equals the frequency of the input signal divided by a preset number M. While the frequency divider 106 is of a fixed type in this embodiment, the frequency divider 106 may be of a variable type so that the value M can be adjusted in accordance with a setting signal applied to its control terminal. An output signal from the frequency divider 106, that is, a reference signal, is applied to a second input terminal of the comparison section 108. In addition, the output signal from the frequency divider 106 is transmitted to the control circuit 111.

The section 108 compares the phases of the output signals from the frequency dividers 106 and 107 and outputs a signal which varies as a function of a difference between the compared phases. An output terminal of the comparison section 108 is connected to an input terminal of a loop filter 110 via a switch or gate 109. A control terminal of the switch 109 is connected to the control circuit 111. The switch 109 selectively breaks and enables the connection between the comparison section 108 and the loop filter 110 in accordance with a control signal supplied from the control circuit 111. An output terminal of the loop filter 110 is connected to a control terminal of the voltage-controlled oscillator 101. When the switch 109 enables the connection between the comparison section 108 and the loop filter 110, the output signal from the comparison section 108 is transmitted to the voltage-controlled oscillator 101 so that the frequency of the RF output signal from the oscillator 101 is controlled in accordance with the difference between the phases of the output signals from the frequency dividers 106 and 107. The control of the frequency of the RF output signal is designed so that the phase of the output signal from the frequency divider 107 will follow or equal the phase of the output signal from the frequency divider 106.

The loop filter 110 includes an integrator or a voltage holding device such as a capacitor. After the switch 109 breaks the connection between the comparison section 108 and the loop filter 110, the voltage of the output signal from the loop filter 110 to the voltage-controlled oscillator 101 remains equal to or essentially equal to the level which occurred at or immediately prior to a moment of the breaking of the connection.

An intermittent operation signal is transmitted to the control circuit 111 and a switch 112 via a terminal 111A. As will be described hereinafter, the control circuit 111 is adjusted in accordance with the intermittent operation signal. A power supply terminal 112A is connected to a constant-voltage source (not shown). The power supply terminal 112A is also connected to the voltage-controlled oscillator 101 and the crystal oscillator 103 via the switch 112. The switch 112 selectively breaks and enables the connection of the oscillators 101 and 103 to the power supply terminal 112A in accordance with the intermittent operation signal. When the switch 112 disconnects the oscillators 101 and 103 from the power supply terminal 112A, they are electrically deactivated. When the switch 112 enables the connection of the oscillators 101 and 103 to the power supply terminal 112A, they are electrically powered. The devices other than the oscillators 101 and 103 are directly connected to the power supply terminal 112A so that they remain electrically powered independent of the intermittent operation signal.

During normal operation, the intermittent operation signal is forcedly held in a high level state at which the switch 112 is closed. While the interminttent operation signal remains in the high level state, the control circuit 111 closes the gates 104 and 105, and the switch 109. Accordingly, during the normal operation, the gates and switches 104, 105, 109, and 112 remain closed. In addition, the oscillators 101 and 103 remain electrically powered. During the normal operation, the frequency of the RF output signal from the voltage-controlled oscillator 101 is controlled in accordance with the difference between the phases of the output signals from the frequency dividers 106 and 107.

During intermittent operation, the intermittent operation signal is periodically changed between a high level state and a low level state. When the intermittent operation signal changes from the high level state to the low level state, the switch 112 is opened so that the oscillators 101 and 103 are electrically deactivated. The deactivation of the oscillators 101 and 103 saves the electric power. When the intermittent operation signal changes from the low level state to the high level state, the switch 112 is closed so that the oscillators 101 and 103 are electrically powered.

During the intermittent operation, when the intermittent operation signal changes from the high level state to the low level state, the oscillators 101 and 103 are electrically deactivated and the control circuit 111 opens the switch 109 so that the loop filter 110 separates from the comparison section 108. After the loop filter 110 separates from the comparison section 108, the loop filter 110 holds charges corresponding to the voltage level which occurred at or immediately prior to the moment of the separation of the loop filter 110 from the comparison section 108. The charge-holding action of the loop filter 110 allows an initial frequency of the RF output signal from the voltage-controlled oscillator 101 to be close to a desired frequency at a moment of the subsequent return of the intermittent operation signal to the high level state. When the intermittent operation signal returns to the high level state, the oscillators 101 and 103 are electrically powered and the control circuit 111 closes the switch 109 so that the loop filter 110 is coupled to the comparison section 108. At the moment of the return of the intermittent operation signal to the high level state, since the initial frequency of the RF output signal from the voltage-controlled oscillator 101 is close to the desired frequency, the frequencies of the output signals from the frequency dividers 106 and 107 are essentially equal. On the other hand, at this moment, a difference between the phases of the output signals from the frequency dividers 106 and 107 is indefinite so that the output signal from the comparison section 108 is also indefinite. Accordingly, after the moment of the return of the intermittent operation signal to the high level state, the frequency of the RF output signal from the voltage-controlled oscillator 101 temporarily deviates from the desired frequency and then moves to the desired frequency due to the PLL action. In this way, the phase matching follows the frequency matching during the initial stage of the control. A time spent in the phase matching is short as will be made clear hereinafter.

When the intermittent operation signal returns to the high level state, the control circuit 111 compares the phases of the output signals from the frequency dividers 106 and 107. As shown in FIG. 2(A), in cases where the phase of the output signal from the frequency divider 107 is in advance of the phase of the output signal from the frequency divider 106, the control circuit 111 outputs a low level control pulse signal to the gate 105, closing the gate 105 and thereby inhibiting the application of the RF signal to the input terminal of the frequency divider 107 for an interval determined by the duration of the gate control pulse. As a result, the phase of the output signal from the frequency divider 107 is retarded until it agrees with the phase of the output signal from the frequency divider 106. The control signal to the gate 105 remains at the low level during an interval between the moments of the occurrences of the leading edges of pulses outputted from the frequency dividers 106 and 107. As shown in FIG. 2(B), in cases where the phase of the output signal from the frequency divider 106 is in advance of the phase of the output signal from the frequency divider 107, the control circuit 111 outputs a low level control pulse signal to the gate 104, closing the gate 104 and thereby inhibiting the application of the RF signal to the input terminal of the frequency divider 106 for an interval determined by the duration of the gate control pulse. As a result, the phase of the output signal from he frequency divider 106 is retarded until it agrees with the phase of the output signal from the frequency divider 107. The control signal to the gate 105 remains at the low level during an interval between the moments of the occurrences of the leading edges of pulses outputted from the frequency dividers 106 and 107. When the agreement between the phases of the output signals from the frequency dividers 106 and 107 is reached, the control circuit 111 closes the switch 109.

Figure 3:
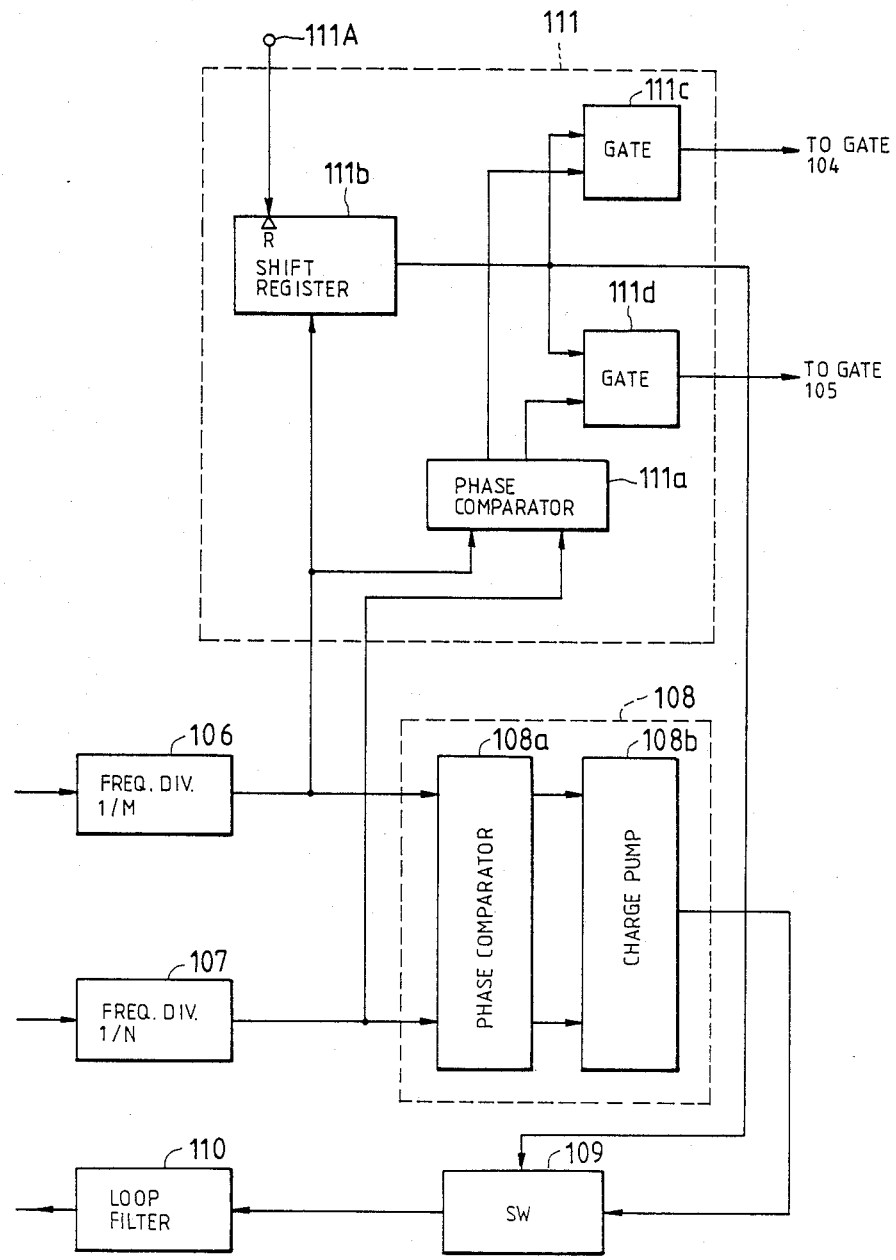
FIG. 3 is a block diagram of internal structures of the control circuit and the comparison section of FIG. 1.

As shown in FIG. 3, the control circuit 111 includes a phase comparator 111a receiving the output signals from the frequency dividers 106 and 107. The phase comparator 111a outputs first and second signals dependent on a difference between the phases of the output signals from the frequency dividers 106 and 107. Specifically, the first output signal from the phase comparator 111a represents that the phase of the output signal from the frequency divider 106 is in advance of the phase of the output signal from the frequency divider 107. The second output signal from the phase comparator 111a represents that the phase of the output signal from the frequency divider 106 is in retard of the phase of the output signal from the frequency divider 107. The first and second output signals from the phase comparator 111a are applied to first input terminals of gates 111c and 111d respectively. The control circuit 111 also includes a 3-bit shift register 111b receiving the output signal from the frequency divider 106 as input clocks and also receiving the intermittent operation signal via the terminal 111A as reset clocks. An output signal from the shift register 111b is applied to second input terminals of the gates 111c and 111d. The output signal from the shift register 111b is also transmitted to the switch 109 as the control signal. An output signal from the gate 111c is applied to the gate 104 (see FIG. 1) as the control signal. An output signal from the gate 111d is applied to the gate 105 (see FIG. 1) as the control signal.

The shift register 111b produces a loop control signal which has a short duration corresponding to three reference periods starting from the commencement of the intermittent operation. The switch 109 is directly controlled by the short loop control signal. The gates 111c and 111d generate the control signals for the gates 104 and 105 in accordance with the short loop control signal and the output signals from the phase comparator 111a, so that the phase adjustment can be performed via the gates 104 and 105 only during an interval corresponding to three reference periods starting from the commencement of the intermittent operation.

As shown in FIG. 3, the comparison section 108 includes a phase comparator 108a receiving the output signals from the frequency dividers 106 and 107. The phase comparator 108a generates signals dependent on a difference between the output signals from the frequency dividers 106 and 107. The phase comparator 108a may be similar to the phase comparator 111a within the control circuit 111. The comparison section 108 also includes a charge pump 108b which converts the output signals from the phase comparator 108a into a corresponding drive signal for the loop filter 110.

It should be noted that various modifications may be made in this embodiment. For example, a prescaler may be disposed between the frequency divider 107 and the gate 105 or between the gate 105 and the distribution device 102.

DESCRIPTION OF THE SECOND PREFERRED EMBODIMENT

Figure 2:
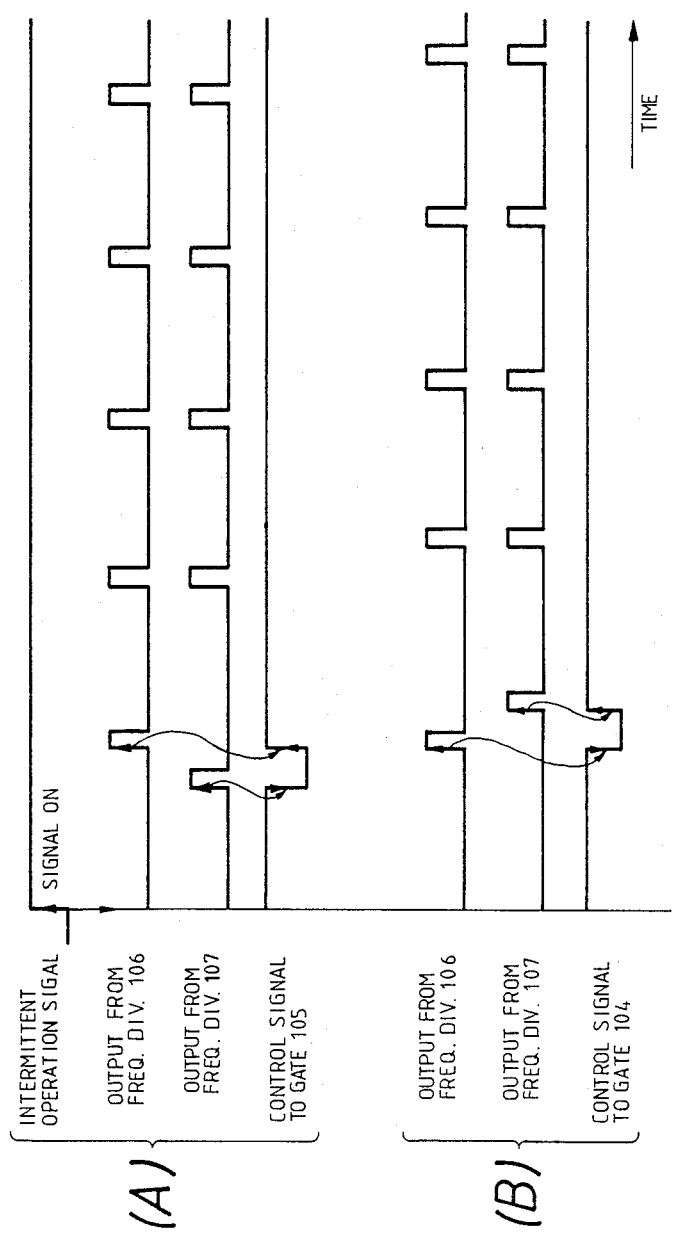
FIGS. 2(A) and 2(B) are timing diagrams of signals which occur in the frequency synthesizer of FIG. 1.
Figure 4:
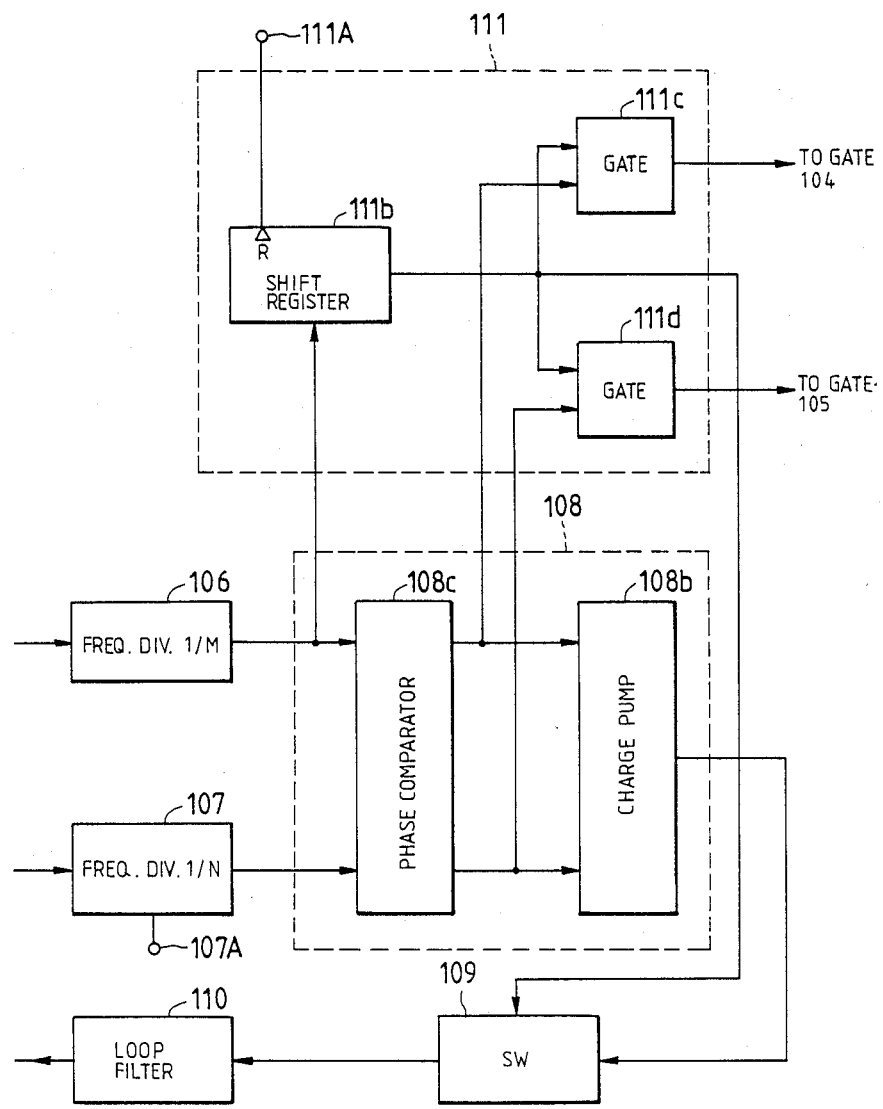
FIG. 4 is a block diagram of a frequency synthesizer according to a second embodiment of this invention.

FIG. 4 shows a second embodiment of this invention which is similar to the embodiment of FIGS. 1–3 except for the following design change.

In the embodiment of FIG. 4, a common phase comparator 108c serves as both of the phase comparators 108a and 111a of FIG. 3.

DESCRIPTION OF THE THIRD PREFERRED EMBODIMENT

Figure 5:
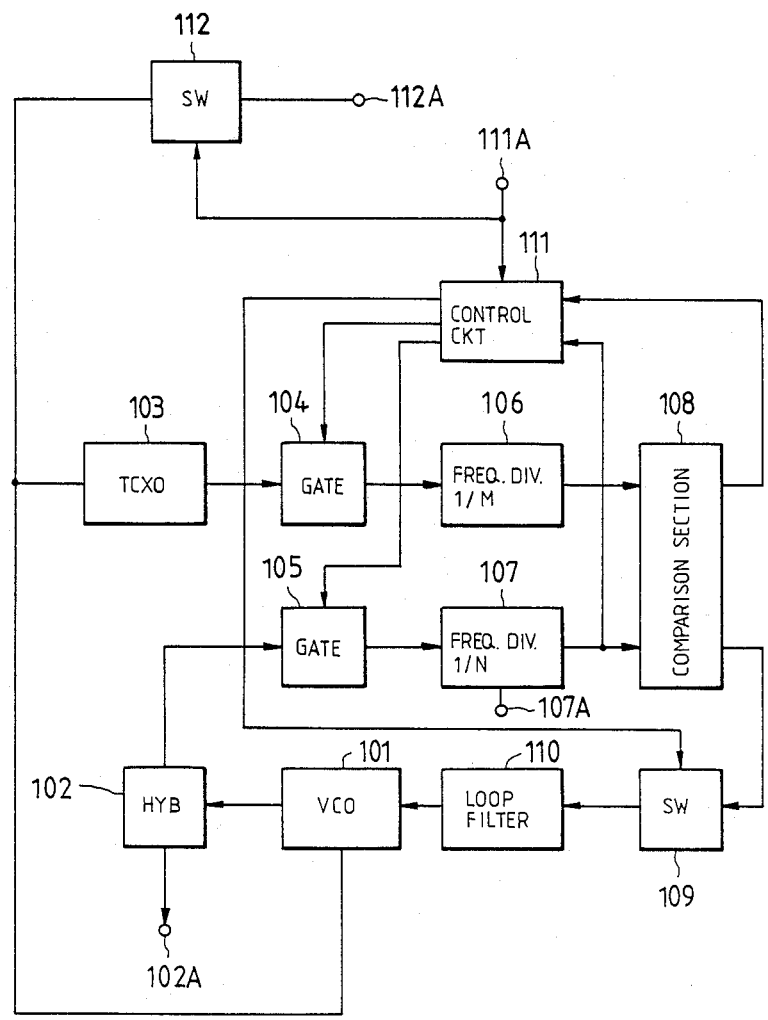
FIG. 5 is a block diagram of a frequency synthesizer according to a third embodiment of this invention.

FIG. 5 shows a third embodiment of this invention which is similar to the embodiment of FIG. 4 except for the following design change.

In the embodiment of FIG. 5, the output signal from the frequency divider 107 is applied to the shift register within the control circuit 111 as input clocks.

What is claimed is:

1. A frequency synthesizer comprising:
    (a) a first oscillator outputting a signal having a reference frequency;
    (b) a first frequency divider dividing the frequency of the output signal from the first oscillator;
    (c) a second oscillator outputting a signal having a target frequency;
    (d) a second frequency divider dividing the frequency of the output signal from the second oscillator;
    (e) a phase comparator comparing phases of output signals from the first and second frequency dividers;
    (f) an integrator integrating an output signal from the phase comparator and controlling the second oscillator in accordance with the integration of the output signal from the phase comparator;
    (g) a first gate connected between the first oscillator and the first frequency divider;
    (h) a second gate connected between the second oscillator and the second frequency divider;
    (i) a third gate connected between the phase comparator and the integrator; and
    (j) means for controlling the first gate, the second gate, and the third gate in accordance with the output signals from the first and second frequency dividers and with an external synthesizer control signal.

2. The frequency synthesizer of claim 1 wherein the controlling means comprises a second phase comparator comparing the phases of the output signals from the first and second frequency dividers, and means for controlling the first gate and the second gate in accordance with an output signal from the second phase comparator.

3. The frequency synthesizer of claim 1 wherein the controlling means comprises a shift register receiving the synthesizer control signal as reset clocks and receiving the output signal from the first frequency divider as input clocks, a fourth gate receiving the output signal from the phase comparator and an output signal from the shift register, the fourth gate being connected to the first gate, and a fifth gate receiving the output signal from the phase comparator and the output signal from the shift register, the fifth gate being connected to the second gate.

4. A frequency synthesizer comprising:
(a) a first oscillator outputting a signal having a reference frequency;
(b) a first frequency divider dividing the frequency of the output signal from the first oscillator;
(c) a second oscillator outputting a signal having a target frequency;
(d) a second frequency divider dividing the frequency of the output signal from the second oscillator;
(e) a phase comparator comparing phases of output signals from the first and second frequency dividers;
(f) a charge pump converting an output signal from the phase comparator into a corresponding integrator drive signal;
(g) an integrator integrating the drive signal and controlling the second oscillator in accordance with the integration of the drive signal;
(h) a first gate connected between the first oscillator and the first frequency divider;
(i) a second gate connected between the second oscillator and the second frequency divider;
(j) a third gate connected between the phase comparator and the integrator; and
(k) means for controlling the first gate, the second gate, and the third gate in accordance with the output signal from the phase comparator, the output signal from the first frequency divider, and an external synthesizer control signal.

5. The frequency synthesizer of claim 4 wherein the controlling means comprises a shift register receiving the synthesizer control signal as reset clocks and receiving the output signal from the first frequency divider as input clocks, a fourth gate receiving the output signal from the phase comparator and an output signal from the shift register, the fourth gate being connected to the first gate, and a fifth gate receiving the output signal from the phase comparator and the output signal from the shift register, the fifth gate being connected to the second gate.

6. A frequency synthesizer comprising:
(a) a first oscillator outputting a signal having a reference frequency;
(b) a first frequency divider dividing the frequency of the output signal from the first oscillator;
(c) a second oscillator outputting a signal having a target frequency;
(d) a second frequency divider dividing the frequency of the output signal from the second oscillator;
(e) a phase comparator comparing phases of output signals from the first and second frequency dividers;
(f) a charge pump converting an output signal from the phase comparator into a corresponding integrator drive signal;
(g) an integrator integrating the drive signal and controlling the second oscillator in accordance with the integration of the drive signal;
(h) a first gate connected between the first oscillator and the first frequency divider;
(i) a second gate connected between the second oscillator and the second frequency divider;
(j) a third gate connected between the phase comparator and the integrator; and
(k) means for controlling the first gate, the second gate, and the third gate in accordance with the output signal from the phase comparator, the output signal from the second frequency divider, and an external synthesizer control signal.

7. The frequency synthesizer of claim 6 wherein the controlling means comprises a shift register receiving the synthesizer control signal as reset clocks and receiving the output signal from the second frequency divider as input clocks, a fourth gate receiving the output signal from the phase comparator and an output signal from the shift register, the fourth gate being connected to the first gate, and a fifth gate receiving the output signal from the phase comparator and the output signal from the shift register, the fifth gate being connected to the second gate.

8. A frequency synthesizer comprising:
(a) a reference oscillator;
(b) a first frequency divider dividing a frequency of an output signal from the reference oscillator;
(c) a variable oscillator;
(d) a second frequency divider dividing a frequency of an output signal from the variable oscillator;
(e) means for comparing phases of output signals from the first and second frequency dividers and generating a phase comparison signal dependent on a difference between the compared phases;
(f) means for controlling the variable oscillator in accordance with the phase comparison signal;
(g) means for selectively enabling and inhibiting application of the output signal from the reference oscillator to the first frequency divider in accordance with the phase comparison signal; and
(h) means for selectively enabling and inhibiting application of the output signal from the variable oscillator to the second frequency divider in accordance with the phase comparison signal.

9. The frequency synthesizer of claim 8 further comprising means for selectively powering and deactivating at least one of the reference oscillator and the variable oscillator.

10. The frequency synthesizer of claim 9 further comprising:
(a) means for, when at least one of the reference oscillator and the variable oscillator is powered, setting an initial frequency of the output signal from the variable oscillator essentially equal to a frequency which occurred at a moment of last deactivation of at least one of the reference oscillator and the variable oscillator; and
(b) means for activating the two of the enabling/inhibiting means during a given period starting from a moment of powering of at least one of the reference oscillator and the variable oscillator.

* * * * *